(12) United States Patent
Tu

(10) Patent No.: US 7,285,489 B2
(45) Date of Patent: Oct. 23, 2007

(54) DUAL DAMASCENE PROCESS FOR FORMING A MULTI-LAYER LOW-K DIELECTRIC INTERCONNECT

(75) Inventor: Jui-Neng Tu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 17 days.

(21) Appl. No.: 11/063,552

(22) Filed: Feb. 24, 2005

(65) Prior Publication Data

US 2005/0142853 A1 Jun. 30, 2005

Related U.S. Application Data

(62) Division of application No. 10/733,814, filed on Dec. 12, 2003, now abandoned.

(51) Int. Cl.
*H01L 21/4763* (2006.01)

(52) U.S. Cl. .................. 438/638; 438/675; 438/687; 257/E21.579

(58) Field of Classification Search ................ 438/633, 438/638, 675, 687, FOR. 355, FOR. 489; 257/E21.579
See application file for complete search history.

(56) References Cited

U.S. PATENT DOCUMENTS

| | | | | |
|---|---|---|---|---|
| 6,114,243 | A * | 9/2000 | Gupta et al. ................. | 438/687 |
| 6,159,845 | A * | 12/2000 | Yew et al. ................... | 438/637 |
| 6,303,486 | B1 * | 10/2001 | Park ............................ | 438/618 |
| 6,376,353 | B1 * | 4/2002 | Zhou et al. .................. | 438/612 |
| 6,403,461 | B1 * | 6/2002 | Tae et al. .................... | 438/619 |
| 6,503,827 | B1 * | 1/2003 | Bombardier et al. ........ | 438/631 |
| 6,605,545 | B2 * | 8/2003 | Wang .......................... | 438/717 |
| 6,664,641 | B2 * | 12/2003 | Ohsaki et al. .............. | 257/774 |
| 6,756,321 | B2 * | 6/2004 | Ko et al. ..................... | 438/778 |
| 6,794,293 | B2 * | 9/2004 | Li et al. ..................... | 438/700 |
| 2004/0080050 | A1 * | 4/2004 | McMillin et al. ........... | 257/758 |
| 2004/0094839 | A1 * | 5/2004 | Fitzsimmons et al. ...... | 257/758 |
| 2004/0110370 | A1 * | 6/2004 | Okayama et al. ........... | 438/638 |

* cited by examiner

*Primary Examiner*—Michelle Estrada
(74) *Attorney, Agent, or Firm*—Rabin & Berdo, P.C.

(57) ABSTRACT

In a dual damascene process for forming a multi-layer low-k dielectric interconnect, the formation of each layer of interconnect comprises deposition of a first low-k dielectric layer, etching of the first low-k dielectric layer to form two dual damascene vias, formation of two Cu conductor plugs enclosed with barrier layers in the two dual damascene vias, etching of the first low-k dielectric layer between the two dual damascene vias to form a trench, and spin-on of a second low-k dielectric layer filled in the trench. The spin-on low-k dielectric layer is selected to have a dielectric constant smaller than that of the first low-k dielectric layer to reduce the equivalent dielectric constant in the layer of interconnect.

6 Claims, 5 Drawing Sheets

US 7,285,489 B2

DUAL DAMASCENE PROCESS FOR FORMING A MULTI-LAYER LOW-K DIELECTRIC INTERCONNECT

CROSS-REFERENCE TO RELATED APPLICATION

This application is a divisional of application Ser. No. 10/733,814, Filed Dec. 12, 2003 now abandoned.

FIELD OF THE INVENTION

The present invention relates generally to a dual damascene process and structure, and more particularly to a dual damascene process for forming a multi-layer low-k dielectric interconnect.

BACKGROUND OF THE INVENTION

Due to the rapid development of integrated circuit (IC) process, the components in an IC are shrunk to attain high density. For the high density and shrinkage, it is required more advanced wiring structure and new materials for better transmission performance. Thus, copper-based conductor is employed to replace the traditional aluminum wiring. High density of IC increases difficulties to the process and therefore, dual damascene process and structure is developed to simplify the fabrication work.

In general, dual damascene process may reduce overall fabrication steps and copper-based conductor may effectively lower the resistance of wiring. However, in an extremely high density IC, formation of dual damascene interconnect with Cu process still faces high RC delay due to high dielectric constant of the inter-layer dielectric (ILD), and delay of the IC in operation arises. Therefore, low-k dielectric is proposed to resolve the problem of such delay.

Utilization of low-k material for ILD may lower the effective dielectric constant of dual damascene interconnect. In U.S. Pat. No. 6,100,184 issued to Zhao et al., for instance, two low-k dielectric layers and an etch-stop dielectric layer inserted therebetween are deposited at first, and then the two low-k dielectric layers are etched to form dual damascene vias to fill Cu plugs therewith. However, this method of lowering the dielectric constant has its limitation. One of the reasons is that the dielectric constant of the aforementioned etch-stop dielectric layer is higher and this boosts up the total dielectric constant. Another reason for this is that no material of lower dielectric constant may be applied to this process. Kitch had proposed another dual damascene process in U.S. Pat. No. 6,143,641, by which method the original dielectric layer is removed after Cu dual damascene plugs are formed in the dielectric layer to fill another low-k dielectric layer to replace the original dielectric layer. Even though further lowering the effective dielectric constant, this process complicates the process as well and likewise, much lower dielectric constant material may not be applied in this process.

Among various low-k dielectric materials, the dielectric constant of fluorinated silicate glass (e.g., FSG) is about 3.5, CVD oxide (e.g., SiOC) is ranged between 2.5 and 3, and spin-on dielectric has a lowest one and smaller than 2.5. Conventional dual damascene process utilizing dielectric materials with dielectric constant between 2.5 and 3 have touched the limit of lowering effective dielectric constant. Therefore, other materials with much lower dielectric constant must be adopted to further reduce the total dielectric constant. Unfortunately, spin-on low-k dielectric having dielectric constant lower than 2.5 is difficult to apply to large area, uniform or thicker deposition and hence, is not suitable for current dual damascene process. In the process, spin-on low-k dielectrics are difficult to control and are only suitable for trench filling. If spin-on low-k dielectrics are employed to replace the conventional dual damascene dielectrics, the yield will be lowered. In other words, conventional dual damascene processes cannot make good use of spin-on low-k dielectrics to lower the effective dielectric constant of dual damascene interconnects. Therefore, it is desired a modified process to utilize spin-on low-k dielectrics to lower the effective dielectric constant of dual damascene interconnects.

SUMMARY OF THE INVENTION

One object of the present invention is to propose a process of forming a multi-layer Cu dual damascene interconnect to lower the effective dielectric constant thereof and thereby reduce the speed delay of the IC employing the multi-layer Cu dual damascene interconnect.

In a dual damascene process for forming a multi-layer low-k dielectric interconnect, according to the present invention, a low-k dielectric layer is deposited on a substrate by CVD and then etched to form a plurality of dual damascene vias, a barrier layer is formed to cover the low-k dielectric layer as well as the exposed surface of the substrate, each dual damascene via is filled with a Cu conductor plug, a second barrier layer is formed to cover on the top of the Cu conductor plugs, the low-k dielectric layer is etched to form trenches between the dual damascene vias, and a spin-on low-k dielectric layer is applied to fill in the trenches.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
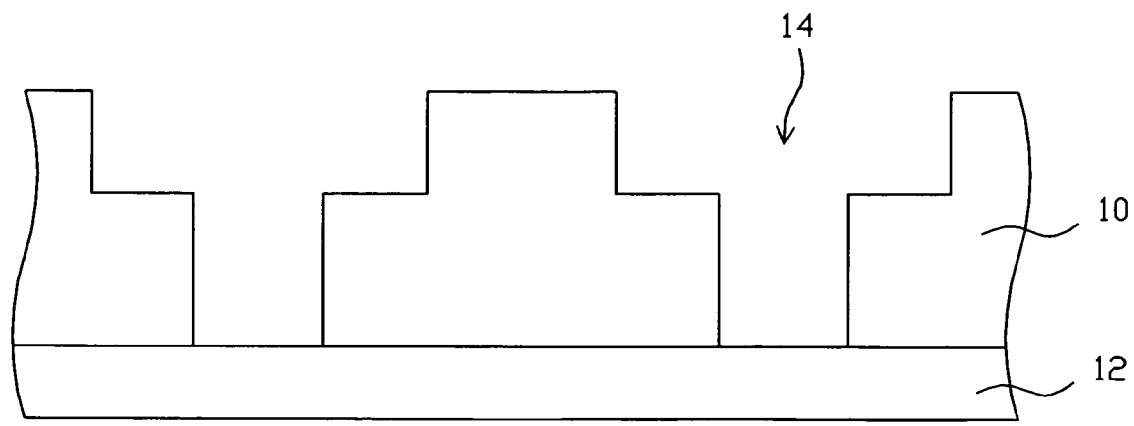
FIG. 1 is the cross-sectional view after the formation of dual damascene vias.

FIGS. 1-8 are provided to illustrate an embodiment dual damascene process of the present invention. As shown in FIG. 1, a dielectric layer 10 is deposited on a substrate 12 and then the dielectric layer 10 is etched to form dual damascene vias 14. The substrate 12 is referred as the layer underlying the dual damascene interconnect, for example some semiconductor materials and/or metallization layer that have manufactured with several electronic devices thereof. The dielectric layer 10 may be an oxide with dielectric constant around 3.5 or a SiOC formed by CVD that has a dielectric constant between 2.5 and 3.

Figure 2:
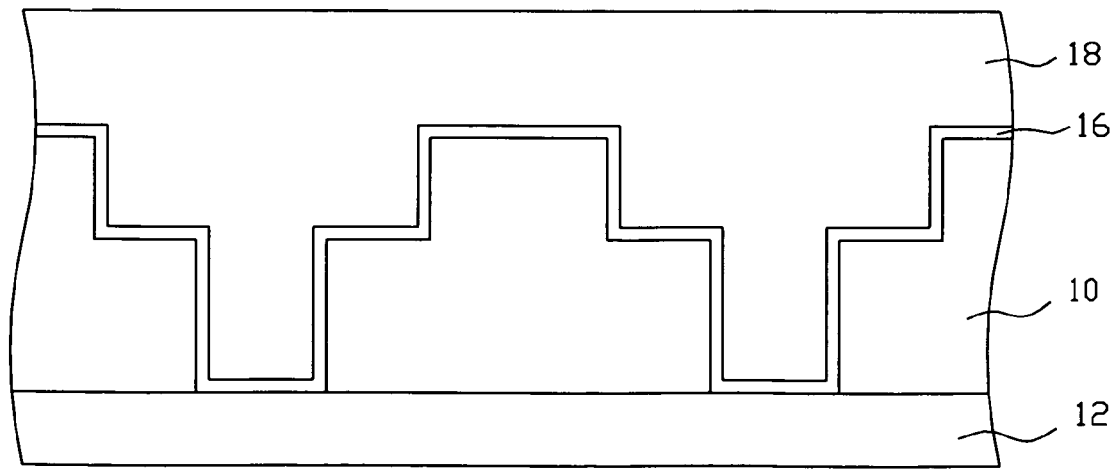
FIG. 2 is the cross-sectional view after the deposition of Cu conductor layer.
Figure 3:
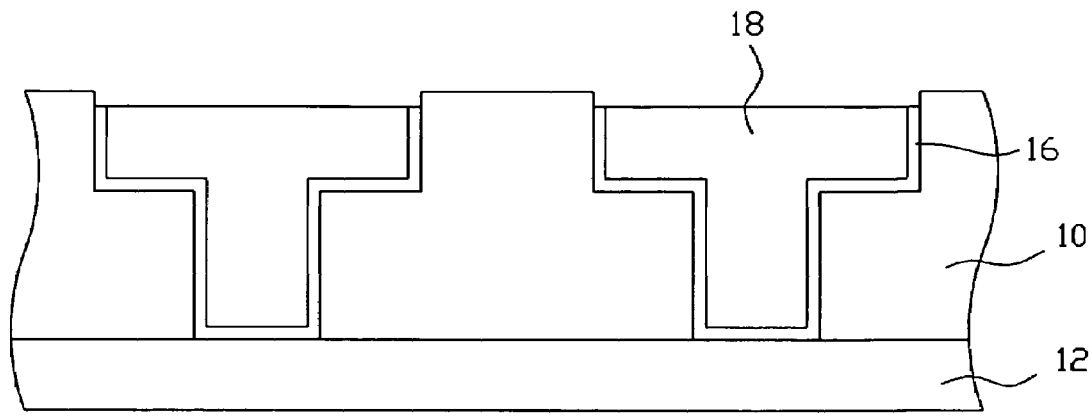
FIG. 3 is the cross-sectional view after the formation of Cu conductor plugs.
Figure 4:
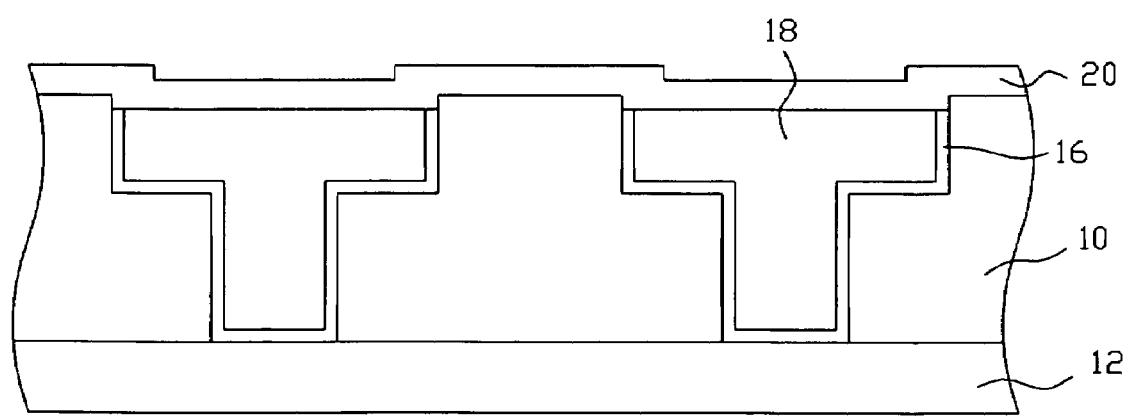
FIG. 4 is the cross-sectional view after the deposition of second barrier layer.
Figure 5:
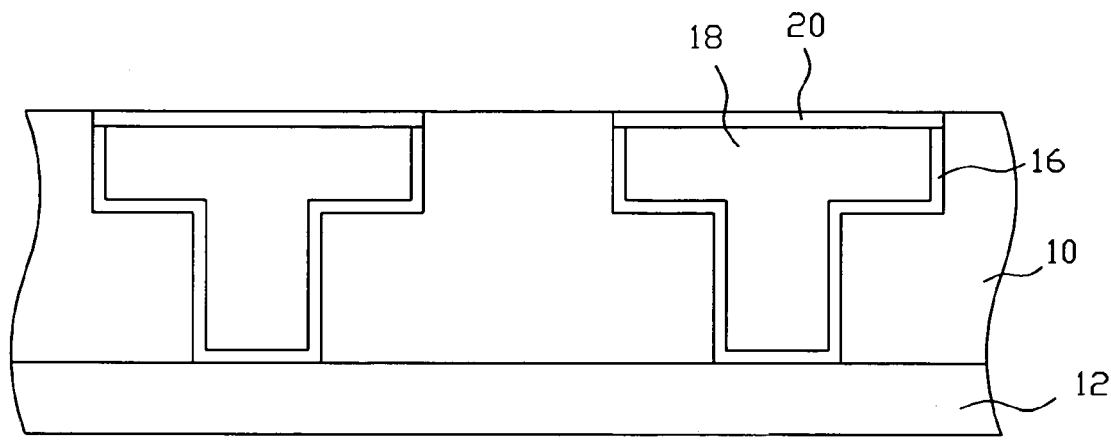
FIG. 5 is the cross-sectional view after the etching-back of the second barrier layer.

As shown in FIG. 2, a barrier layer 16 is formed and covered on the dielectric layer 10 and substrate 12, including the sidewall of the vias 14. The barrier layer 16 is made of materials capable of stopping Cu diffusion. Cu conductor 18 is then deposited to fill in the via 14. As shown in FIG. 3, the Cu conductor 18 and barrier layer 16 are etched back and thereby left only the parts in the vias 14. Next, as shown in FIG. 4, another barrier layer 20 is deposited on the Cu conductor 18, and the barrier layer 20 is also made of materials capable of stopping Cu diffusion. The barrier layers 16 and 20 may be made of materials selected from metal, metal alloy and metal compound. Chemical mechanical polishing (CMP) is applied to etch-back the barrier layer 20 so as to leave only the part above the vias 14, as shown in FIG. 5.

Figure 6:
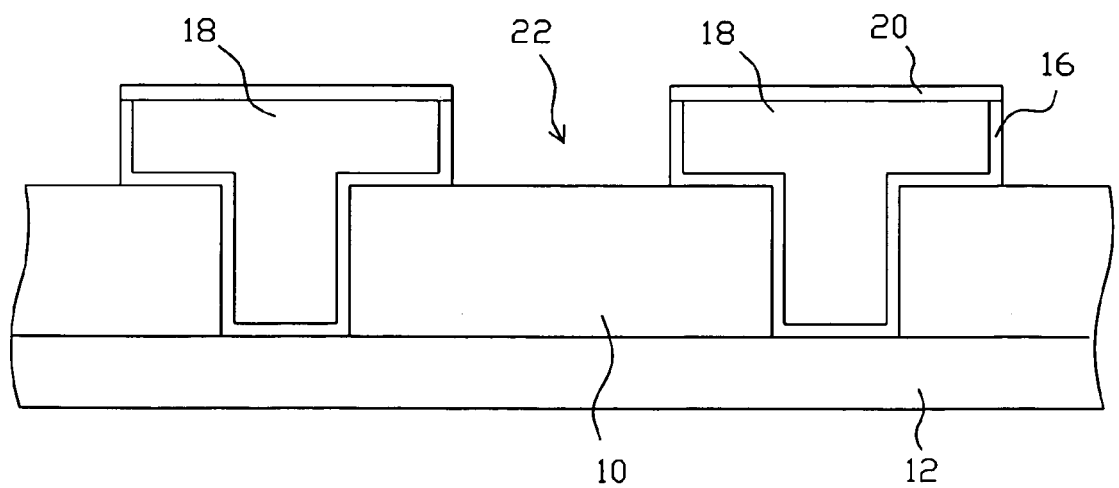
FIG. 6 is the cross-sectional view after the etching-back of the first low-k dielectric layer.
Figure 7:
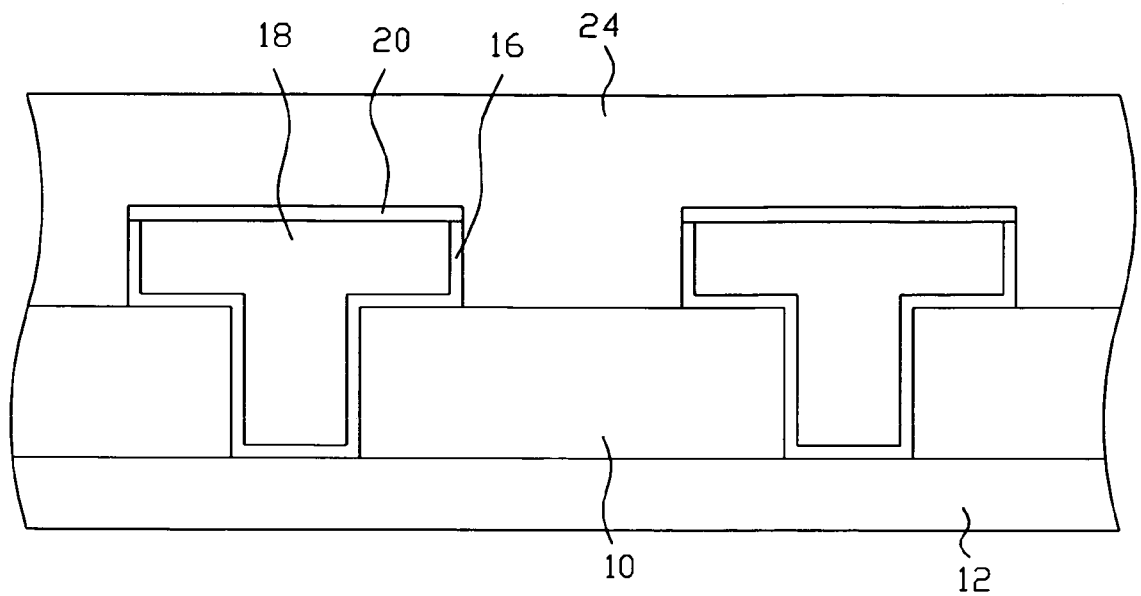
FIG. 7 is the cross-sectional view after the spinning-on of second dielectric layer.
Figure 8:
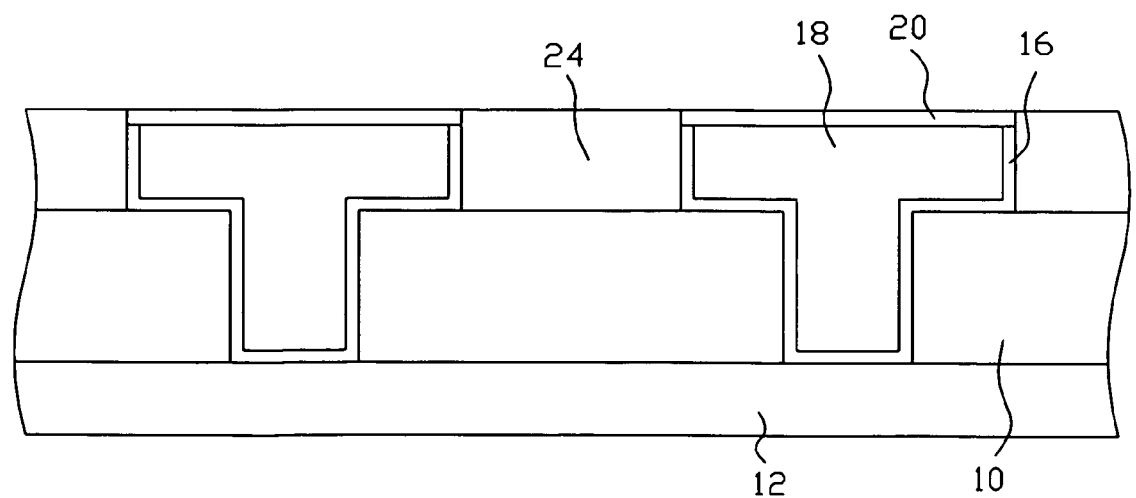
FIG. 8 is the cross-sectional view after the planarization of the second dielectric as well as barrier layers.

Next, as shown in FIG. 6, the dielectric layer 10 is etched to form trenches 22 each between two Cu conductor plugs 18. A spin-on low-k dielectric layer 24 is filled in the trenches 22, as shown in FIG. 7. The spin-on low-k dielectric layer 24 has a dielectric constant less than 2.5. As shown in FIG. 8, the dielectric layer 24 is etched-back to planarize the top surfaces of the dielectric layer 24 and barrier layer 20. To this point, a single layer of dual damascene interconnect is obtained.

The principle and features of the inventive dual damascene process are described below. CVD is used at first to form the large area and uniform dielectric 10 to the desired thickness, whose dielectric constant is between 2.5 and 3. After the Cu conductor plugs 18 are performed, some parts of the dielectric layer 10 are removed and become thinner thereof. The removed space, i.e., the trenches 22, is filled with spin-on low-k dielectric instead. Thus, the total or equivalent dielectric constant of the resulted ILD is lowered and high yield is maintained.

Figure 9:
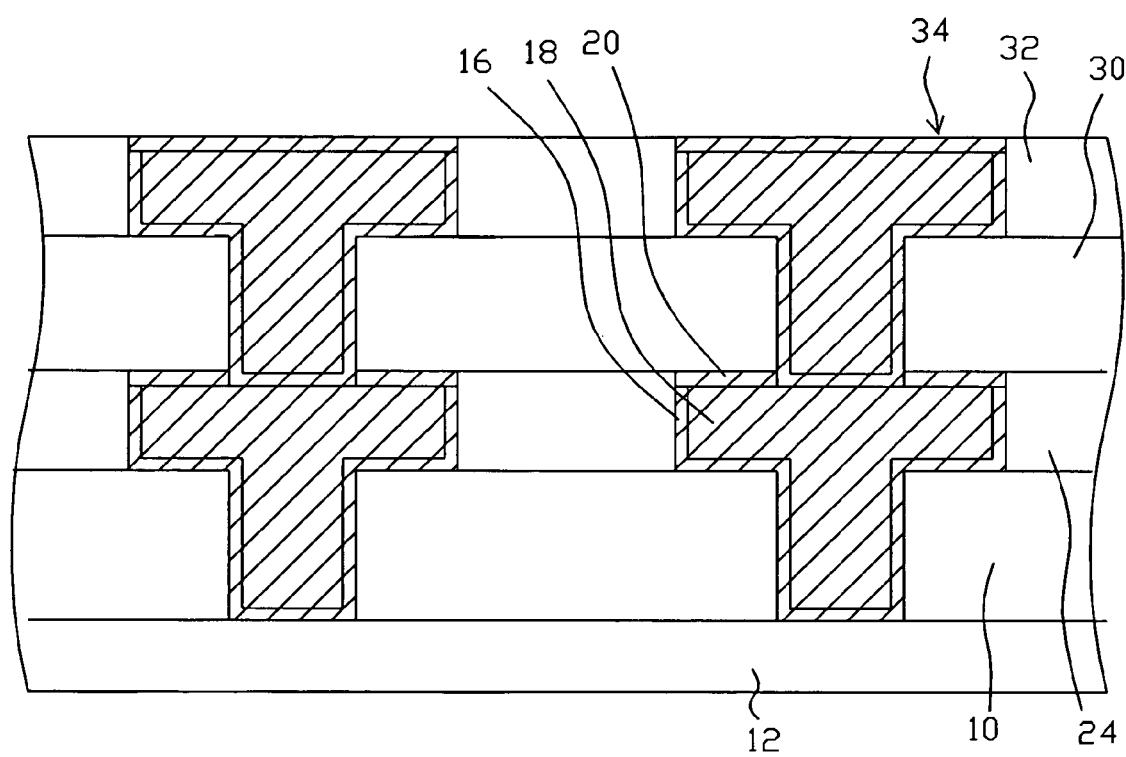
FIG. 9 is the cross-sectional view after the formation of multi-layer dual damascene interconnect.

Repeating the aforementioned steps will obtain a multi-layer dual damascene interconnect. As shown in FIG. 9, for example, repeating the steps of FIGS. 1-8 will form another layer of dual damascene interconnect after the dual damascene interconnect shown in FIG. 8 is completed. In detail, the second layer of dual damascene interconnect comprises a layer of SiOC 30 deposited on the surface of the dielectric 24 and barrier layer 20 by CVD, Cu conductor plugs 34 enclosed by barrier layers extend through the dielectric layer 30 and the barrier layer 20 to electrically connect the Cu conductor plugs 18 underneath, and the spin-on low-k dielectric is further filled between the Cu conductor plugs 34. This way more layers of dual damascene interconnects may thus be achieved in stack layer by layer, each of them comprises a CVD SiOC and spin-on low-k dielectric layer inserted between the Cu conductor plugs.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A dual damascene process for forming multi-layer low-k interconnects, comprising the steps of:
    depositing a first low-k dielectric layer on a surface;
    etching said first low-k dielectric layer to form two dual damascene vias extending through said first low-k dielectric layer and exposing portions of said surface;
    forming a first barrier layer for covering said first low-k dielectric layer and said portions of said surface;
    forming two Cu conductor plugs each filling one of said two dual damascene vias;
    forming a second barrier layer for covering said two Cu conductor plugs to enclose said two Cu conductor plugs by said first and second barrier layers;
    etching-back only part of a thickness of said first low-k dielectric layer to form a trench between said two dual damascene vias after forming said two Cu conductor plugs and after forming said second barrier layer;
    spinning-on a second low-k dielectric layer in said trench, said second low-k dielectric layer having a lower k than said first low-k dielectric layer;
    etching back said second low-k dielectric layer to planarize said second low-k dielectric layer to said second barrier layer;
    depositing a third low-k dielectric layer on said second low-k dielectric and barrier layers;
    etching said third low-k dielectric and second barrier layers to form two second dual damascene vias extending through said third low-k dielectric and second barrier layers and exposing surfaces of said two Cu conductor plugs;
    forming a third barrier layer for covering said third low-k dielectric layer and said surfaces of said two Cu conductor plugs;
    forming two second Cu conductor plugs each filling one of said second two dual damascene vias;
    forming a fourth barrier layer for covering said two second Cu conductor plugs to enclose said two second Cu conductor plugs by said third and fourth barrier layers;
    etching-back said third low-k dielectric layer to form a second trench between said two second dual damascene vias; and
    spinning-on a fourth low-k dielectric layer in said second trench, said fourth low-k dielectric layer having a lower k than said third low-k dielectric layer.

2. The process of claim 1, wherein said forming two Cu conductor plugs each filling one of said two dual damascene vias comprises the steps of:
    depositing a Cu conductor layer that fills said two dual damascene vias; and
    etching-back said Cu conductor layer but leaving said Cu conductor layer in said two dual damascene vias.

3. The process of claim 2, further comprising etching said first barrier layer but leaving said first barrier layer in said two dual damascene vias after said etching-back said Cu conductor layer.

4. The process of claim 1, wherein said forming a second barrier layer comprises the steps of:
    depositing said second barrier layer on said two Cu conductor plugs and first low-k dielectric layer; and
    applying CMP to said second barrier layer but leaving said second barrier layer over said two dual damascene vias.

5. The process of claim 1, wherein said depositing a first low-k dielectric layer comprises depositing a SiOC layer by CVD.

6. The process of claim 1, wherein said etching-back said first low-k dielectric layer comprises wet etching said first low-k dielectric layer.

* * * * *